United States Patent
Bartonek

(10) Patent No.: US 9,263,358 B2
(45) Date of Patent: Feb. 16, 2016

(54) CRASHWORTHY MEMORY MODULE HAVING A CRACK REPAIR SYSTEM

(71) Applicant: Progress Rail Services Corporation, Albertville, AL (US)

(72) Inventor: Mark Joseph Bartonek, Independence, MO (US)

(73) Assignee: Progress Rail Services Corporation, Albertville, AL (US)

( * ) Notice: Subject to any disclaimer, the term of this patent is extended or adjusted under 35 U.S.C. 154(b) by 0 days.

(21) Appl. No.: 14/331,779

(22) Filed: Jul. 15, 2014

(65) Prior Publication Data

US 2016/0018858 A1    Jan. 21, 2016

(51) Int. Cl.
| | |
|---|---|
| *H01L 23/16* | (2006.01) |
| *H05K 5/06* | (2006.01) |
| *H05K 5/02* | (2006.01) |
| *H01L 23/15* | (2006.01) |
| *H01L 23/18* | (2006.01) |

(52) U.S. Cl.
CPC .............. *H01L 23/15* (2013.01); *H01L 23/18* (2013.01); *H05K 5/062* (2013.01)

(58) Field of Classification Search
None
See application file for complete search history.

(56) References Cited

U.S. PATENT DOCUMENTS

| | | | |
|---|---|---|---|
| 4,189,697 A | | 2/1980 | Hara |
| 4,837,547 A | | 6/1989 | Nixon et al. |
| 5,845,272 A | | 12/1998 | Morjaria et al. |
| 6,158,833 A | * | 12/2000 | Engler .......................... 312/409 |
| 6,924,027 B2 | | 8/2005 | Matayabas, Jr. et al. |
| 7,206,505 B2 | | 4/2007 | Gasper |
| 7,703,291 B2 | | 4/2010 | Bushnik et al. |
| 8,121,752 B2 | * | 2/2012 | Winterhalter et al. ........ 701/32.2 |
| 2006/0272838 A1 | * | 12/2006 | Sauerzweig .............. 174/17 SF |
| 2011/0019355 A1 | * | 1/2011 | Cleveland ................ 361/679.31 |
| 2011/0178699 A1 | * | 7/2011 | Ogawa .......................... 701/200 |
| 2013/0162387 A1 | | 6/2013 | Kelley |

OTHER PUBLICATIONS

U.S. Patent Application of Mark Joseph Bartonek, entitled "Crashworthy Memory Module Having a Thermal Wiring Disconnect System" filed on Jul. 15, 2014.

U.S. Patent Application of Mark Joseph Bartonek et al., entitled "Crashworthy Memory Module Having a Thermal Cutoff" filed on Jul. 15, 2014.

* cited by examiner

*Primary Examiner* — Joseph Schoenholtz
(74) *Attorney, Agent, or Firm* — Finnegan, Henderson, Farabow, Garrett & Dunner, LLP

(57) ABSTRACT

A memory module is disclosed. The memory module may have an insulator. The memory module may also have a device disposed within the insulator. The memory module may further have a filler disposed on the device. The filler may be configured to expand and flow into one or more cracks in the insulator, when the filler is subjected to a threshold temperature.

20 Claims, 5 Drawing Sheets

US 9,263,358 B2

CRASHWORTHY MEMORY MODULE HAVING A CRACK REPAIR SYSTEM

TECHNICAL FIELD

The present disclosure relates generally to a crashworthy memory module and, more particularly, to a crashworthy memory module having a crack repair system.

BACKGROUND

Modern locomotives typically include one or more crashworthy memory modules or "black boxes" that record and communicate information including voice and image data and vehicle performance parameters received from event recorders or locomotive control computers. Data retrieved from a crashworthy memory module after an accident involving a locomotive can help reconstruct and provide a detailed and accurate accounting of events leading up to and during the accident. Crashworthy memory modules, therefore, store the recorded information in a crash-hardened memory unit designed and built to withstand the severe conditions that may occur during the accident.

An accident involving a locomotive may include fires caused due to spillage of fuel from the locomotive or from railroad cars attached to or located near the accident scene. A crashworthy memory module may be subjected to temperatures as high as 1400° F. because of such fires. Crashworthy memory modules are designed to withstand such high temperatures and smolder temperature as high as 500° F. for 10 hours or more without allowing the high temperatures to adversely affect electronic data stored within the crashworthy memory module. Although the crashworthy memory module and electronic components within the crashworthy memory module are heavily insulated, heat may still enter the crashworthy memory module through electrical wires connecting the electronic components within the crashworthy memory module to locomotive subsystems located outside the crashworthy memory module. To prevent damage to the electronic components that store data within the memory module, it is important to repair or seal the cracks to prevent heat from outside the memory module from being transferred through the cracks in the insulation to the electronic components inside the memory module.

One attempt to address some of the problems described above is disclosed in U.S. Pat. No. 7,703,291 of Bushnik et al. that issued on Apr. 27, 2010 ("the '291 patent"). In particular, the '291 patent discloses an environmental control system for a hard drive of an event recorder. The disclosed thermoelectric module transfers heat between the hard drive and a housing of the event recorder, in response to an applied voltage, in order to maintain a hard drive temperature within a hard drive operable temperature range. The '291 patent also discloses an active thermoelectric controller for actively drawing heat away from the hard drive and out of the housing. The thermoelectric controller can include a heat sink coupled to the thermoelectric module and to the housing for dissipating heat from the thermoelectric module to the housing.

Although the '291 patent discloses a system for controlling the temperature of a hard drive of an event recorder, the disclosed system may still be inadequate. For example, the system of the '291 patent requires an applied voltage to control the hard drive temperature. After an accident, however, equipment which provides the applied voltage may not function rendering the thermal control system of the '291 patent inadequate. Further, the system of the '291 patent may not prevent heat from a fire outside the event recorder from entering the event recorder through cracks in the insulation surrounding the event recorder or the hard drive.

The crashworthy memory module of the present disclosure solves one or more of the problems set forth above and/or other problems in the art.

SUMMARY

In one aspect, the present disclosure is directed to a memory module. The memory module may include an insulator. The memory module may also include a device disposed within the insulator. The memory module may further include an insulator disposed on the device. The insulator may be configured to expand and flow into one or more cracks in the insulator, when the insulator is subjected to a threshold temperature.

In another aspect, the present disclosure is directed towards a crack repair system for a device disposed within an insulator. The crack repair system may include a gap between the device and one or more walls of the insulator. The crack repair system may also include an insulator disposed in the gap. The insulator may be configured to expand and flow into one or more cracks in the one or more walls, when subjected to a threshold temperature.

In another aspect, the present disclosure is directed to a method of manufacturing a memory module. The method may include fabricating an insulator having an enclosure. The method may also include disposing an insulator on a device. The method may further include assembling the device in the enclosure, such that when the insulator is subjected to a threshold temperature, the insulator is configured to expand and flow into one or more cracks in the enclosure.

DETAILED DESCRIPTION

Figure 1:
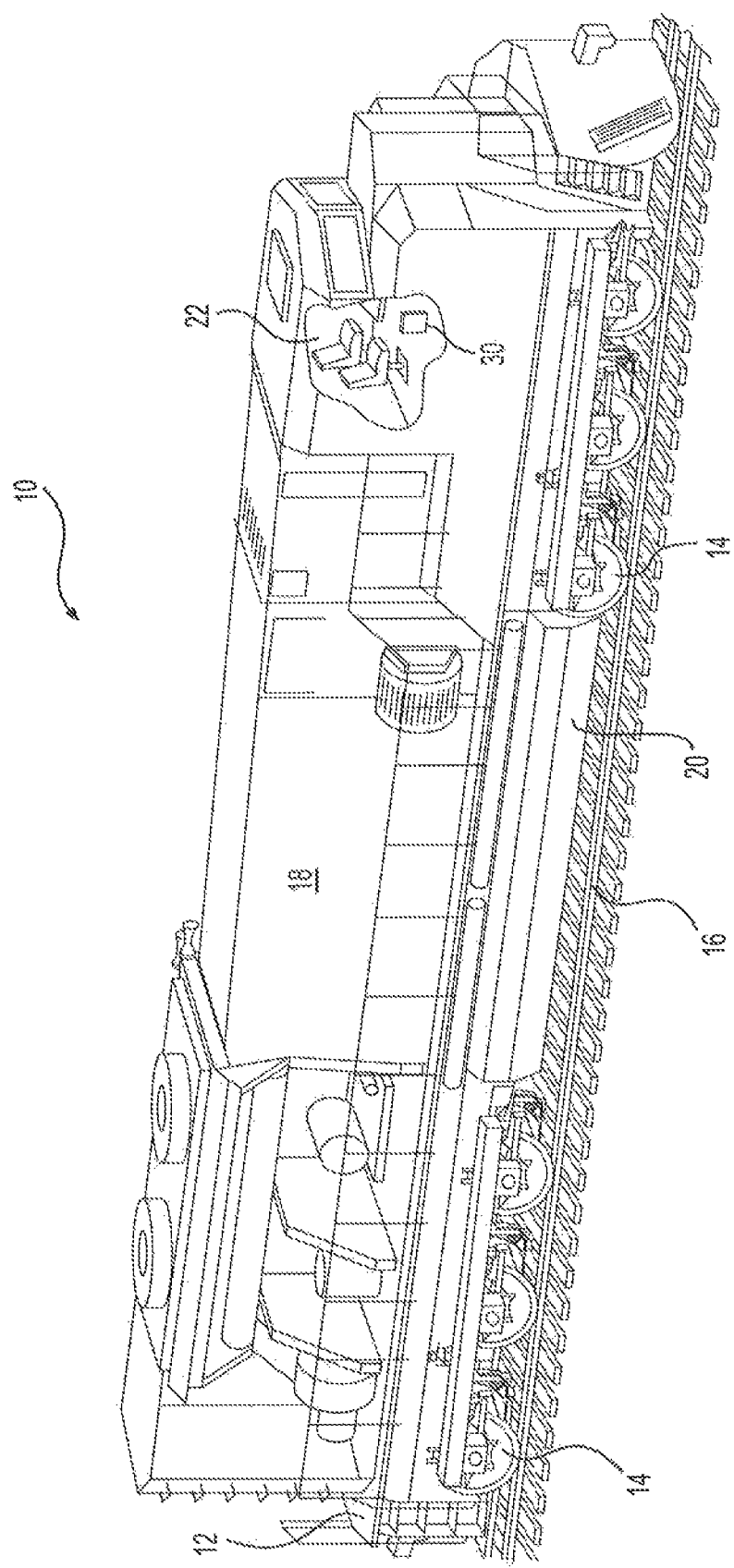
FIG. 1 is a pictorial illustration of an exemplary disclosed machine equipped with a memory module.

FIG. 1 illustrates an exemplary embodiment of a machine 10. For example, as shown in FIG. 1, machine 10 may be a locomotive designed to pull rolling stock. Machine 10 may have a platform 12 supported by a plurality of wheels 14, which may be configured to engage track 16. Wheels 14 may have traction motors (not shown) associated with them, which may drive wheels 14 to propel machine 10 in a forward or rearward direction.

Machine 10 may have an engine 18 mounted on platform 12. Engine 18 may be configured to receive fuel from fuel tank 20 and to drive one or more generators (not shown), which may generate power to drive the traction motors. Although FIG. 1 depicts one engine 18 and one fuel tank 20, it is contemplated that machine 10 may have more than one engine 18 and/or fuel tank 20. In an exemplary embodiment, as shown in FIG. 1, engine 18 may be lengthwise aligned on platform 12 along a travel direction of machine 10. One skilled in the art will recognize, however, that engine 18 may be located in tandem, transversally, or in any other orientation on platform 12. Machine 10 may also include operator cabin 22 from where an operator (not shown) may be able to control operations performed by machine 10. Although, FIG. 1 illustrates a locomotive, machine 10 may be any type of mobile machine including an automobile, an aircraft, a boat or a ship, or any other type of construction, mining, or farming machine known in the art Machine 10 may include one or more memory modules 30. Memory modules 30 may be crashworthy memory modules capable of surviving an accident or a crash. In one exemplary embodiment, memory module 30 may be configured to record operational parameters, input parameters, and/or a variety of data from one or more event recorders or control computers of machine 10. The various types of data may include video data and audio data, machine data indicative of one or more machine operating parameters, machine control signals, machine performance characteristics, and engine operating and performance data. Data may also include, for example, electrical data, exhaust characteristics, and positive machine control data indicative of an actual location of a machine, sound of a horn, voice recording of anything spoken by the an operator, actuation of a brake lever by the operator, a signal received from a GPS sensor, a change in throttle setting, a sudden change in exhaust characteristics, the position of the machine relative to a crossing, and the speed and acceleration or deceleration of the machine. As illustrated in FIG. 1, memory module 30 may be located in operator cabin 22 of machine 10. It is contemplated, however, that memory module 30 may be located anywhere on machine 10.

Figure 2:
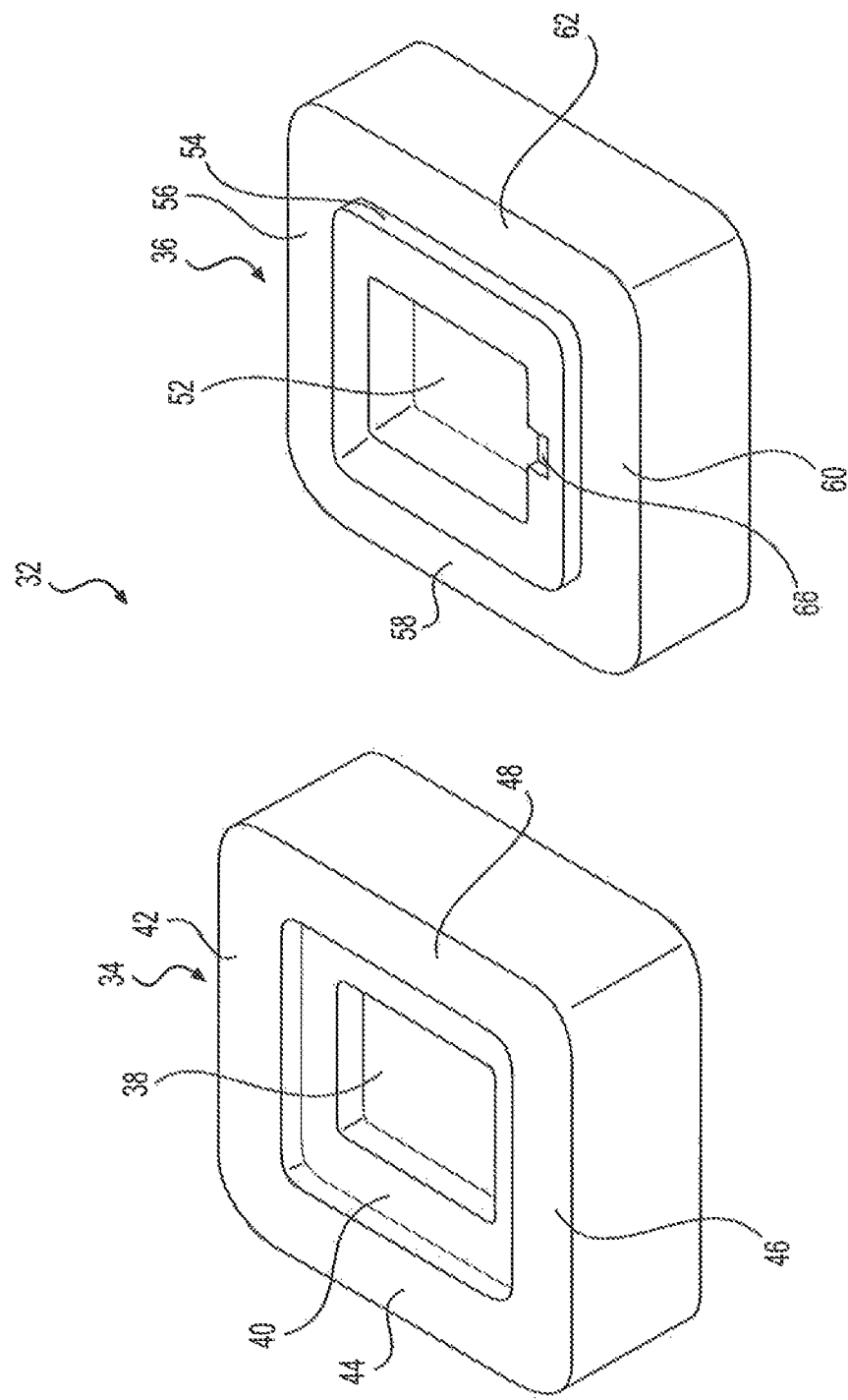
FIG. 2 is a diagrammatic view of an insulator of the exemplary disclosed memory module of FIG. 1.

FIG. 2 illustrates a diagrammatic view of an insulator 32 of an exemplary disclosed memory module 30. Insulator 32 may include a top portion 34 and a bottom portion 36. Top portion 34 may have an inner upper recess 38, an outer upper recess 40, first side wall 42, second side wall 44, third side wall 46, fourth side wall 48, and top wall 50 (see FIG. 4). First, second, third, and fourth side walls 42, 44, 46, 48, and top wall 50 may have the same or different thicknesses. Further, the thicknesses of first, second, third, and fourth side walls 42, 44, 46, 48, and top wall 50 may be uniform or non-uniform over their respective surfaces. As illustrated in FIG. 2, bottom portion 36 may have a lower recess 52, protrusion 54, fifth side wall 56, sixth side wall 58, seventh side wall 60, eight side wall 62, and bottom wall 64 (see FIG. 4). Lower recess 52 may be formed within protrusion 54. Fifth, sixth, seventh, and eighth side walls 56, 58, 60, 62, and bottom wall 64 may have the same of different thicknesses. Further, the thicknesses of fifth, sixth, seventh, and eighth side walls 56, 58, 60, 62, and bottom wall 64 may be uniform or non-uniform over their respective surfaces. Inner upper recess 38, outer upper recess 40, and lower recess 52 may have a square or rectangular shape. It is contemplated, however, that inner upper recess 38, outer upper recess 40, and lower recess 52 may have a circular, triangular, polygonal, or any other shape known in the art. In one exemplary embodiment, insulator 32 may have a length of about 5.0 to 6.0 inches, a width of about 5.0 to 6.0 inches, and a height of about 3.0 to 4.0 inches. In another exemplary embodiment, the thickness of side walls 42, 44, 46, 48, 56, 58, 60, 62 of insulator 32 may be about 0.8 to 1.5 inches. In yet another exemplary embodiment, the thicknesses of top wall 50 and bottom wall 64 may be about 1.0 to 1.5 inches. The terms "top," "bottom," "upper," and "lower" as used in this disclosure merely distinguish features associated with the top and bottom portions 34, 36 of insulator 32 and should not be interpreted to mean that top and bottom portions 34, 36 and/or memory module 30 are disposed in machine 10 in any particular orientation.

Figure 3:
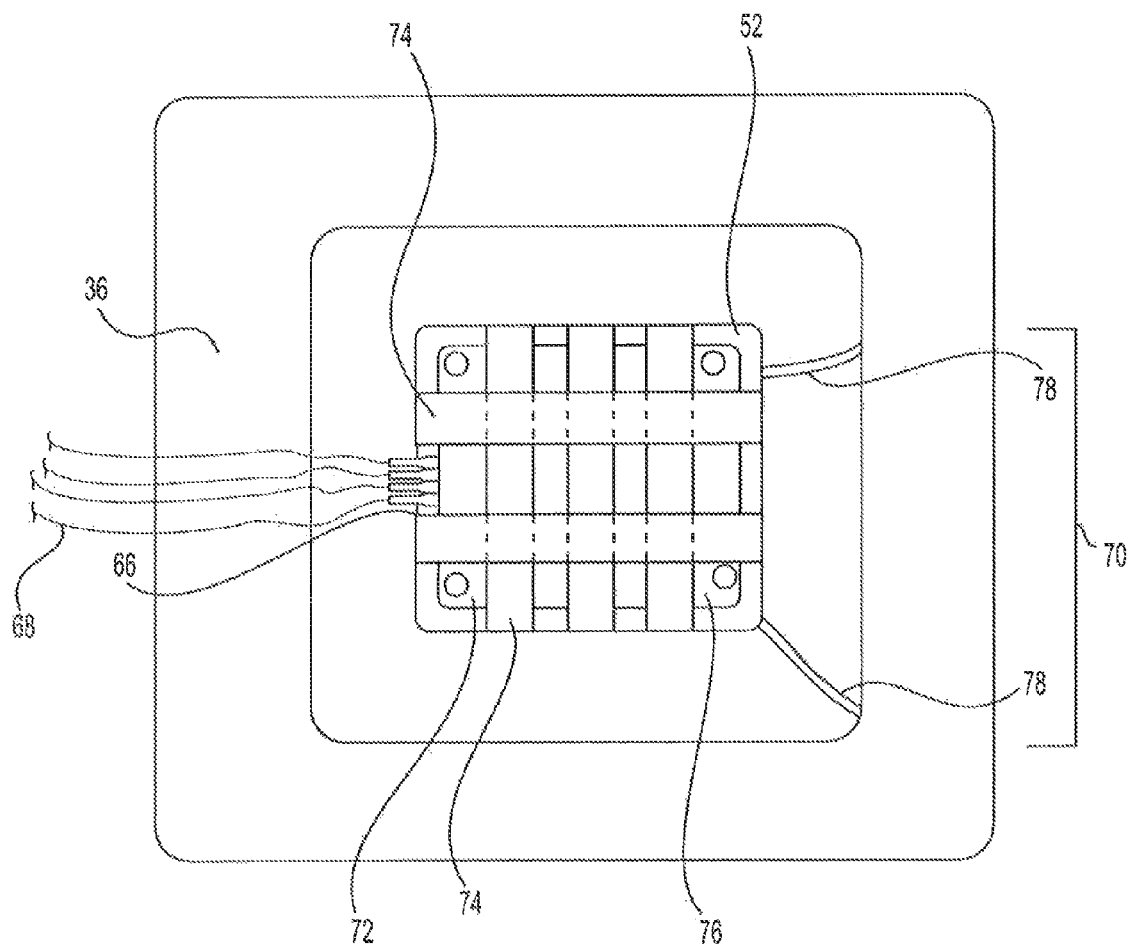
FIG. 3 is another diagrammatic view showing a portion of the of the exemplary disclosed memory module of FIG. 1.

Bottom portion 36 may also include slot 66 to allow passage for wires 68 (see FIG. 3) connected to device 72 (see FIG. 3). As illustrated in FIG. 2, slot 66 may be disposed in protrusion 54 of bottom portion 36. It is contemplated, however, that slot 66 may be disposed on any of side walls 42, 44, 46, 48, 56, 58, 60, 62, top wall 50, and/or bottom wall 64 of top and/or bottom portions 34, 36. Although FIG. 2 illustrates only one slot 66, it is contemplated that insulator 32 may have any number of slots 66 disposed in top portion 34 and/or bottom portion 36. Slot 66 may be square, rectangular, circular, elliptical, or may have any other shape known in the art. In one exemplary embodiment, slot 66 may be about 0.4 to 0.5 inches wide and about 0.1 to 0.2 inches deep.

Top portion 34 and bottom portion 36 of insulator 32 may be made of an insulating material. It is contemplated that top portion 34 and bottom portion 36 may be made out of materials such as ceramic, fiberglass, plastic, polymer, Bakelite, microporous insulation such as silica or any other insulating materials known in the art. In one exemplary embodiment, top portion 34 and bottom portion 36 may be attached to each other via for example, an adhesive or by any other method of bonding surfaces known in the art.

FIG. 3 illustrates another diagrammatic view of a portion of memory module 30 having a crack repair system 70. As illustrated in FIG. 3, device 72 may be assembled in lower recess 52. Device 72 may be an enclosure including a variety of electronic components designed to receive and record various types of data. In one exemplary embodiment, device 72 may include at least a controller (not shown), one or more storage devices (not shown), and other electronic components associated with memory module 30. Memory module 30 may include filler 74. In one exemplary embodiment, as illustrated in FIG. 3, filler 74 may be disposed on outer surface 76 of device 72 in the form of strips of filler material spaced apart from each other both along the lengthwise and widthwise directions of device 72. It is contemplated, however, that filler 74 may be disposed on outer surface 76 of device 72 in the form of a sheet covering an entire outer surface 76 of device 72. In one exemplary embodiment, filler 74 may be wrapped around device 72. In another exemplary embodiment, strips of filler 74 spaced apart from each other may be wrapped around a length and a width of device 72.

FIG. 3 also illustrates one or more cracks 78 which may form in bottom portion 36 of insulator 32 because of impact forces of an accident or because of exposure to excessive heat caused by fires accompanying the accident. Although FIG. 3 illustrates cracks 78 in bottom portion 36, one skilled in the art would recognize that cracks 78 may also be formed in top portion 34 of insulator 32.

Figure 4:
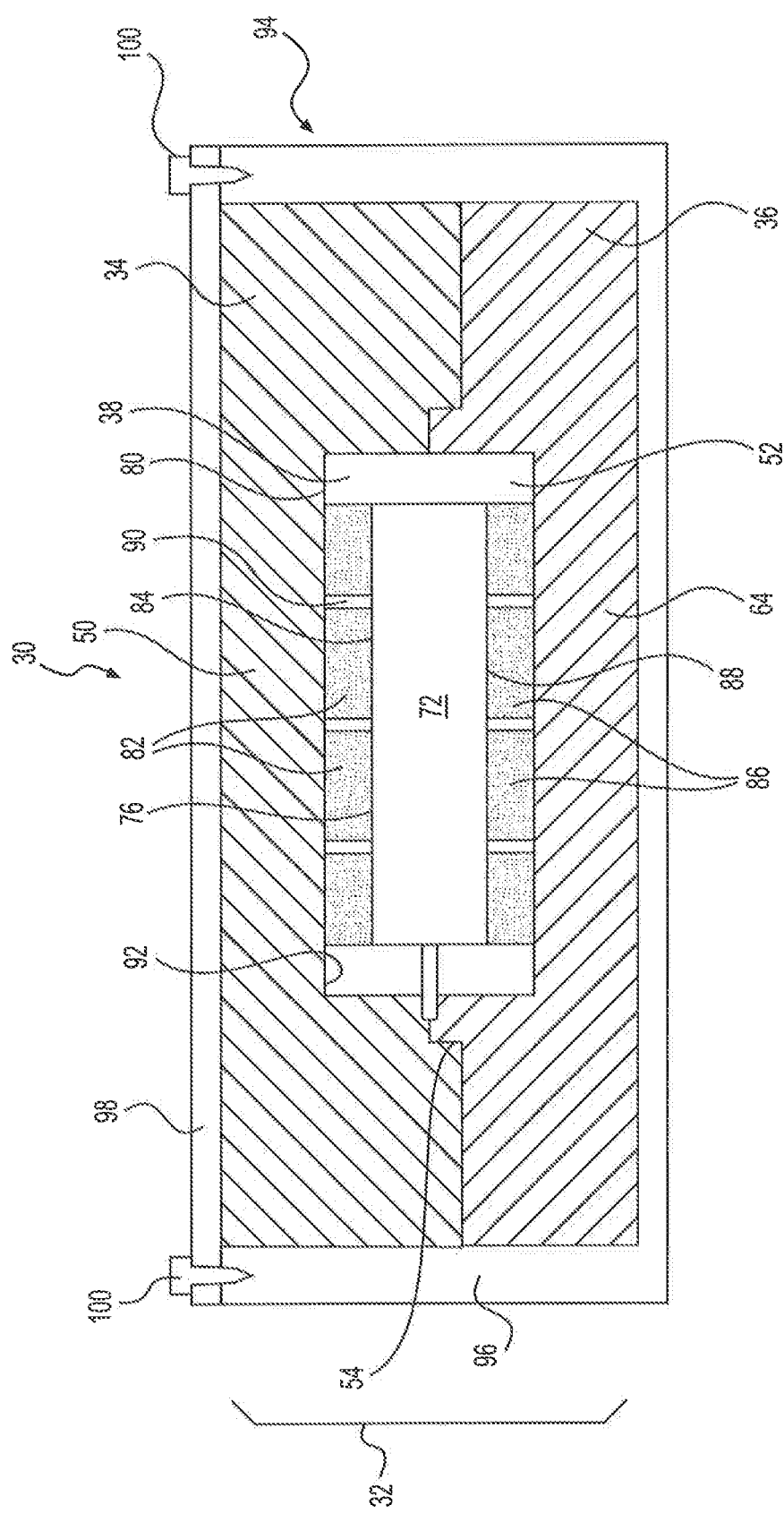
FIG. 4 is a diagrammatic view of a cross-section of the exemplary disclosed memory module of FIG. 1.

FIG. 4 illustrates a diagrammatic view of a vertical cross-sectional of an exemplary disclosed memory module 30. As illustrated in FIG. 4, device 72 may be disposed in enclosure 80 formed by top portion 34 and bottom portion 36 of insulator 32. As further illustrated in FIG. 4, first filler portion 82 of filler 74 may be disposed on first side 84 of device 72 in inner upper recess 38. Second filler portion 86 of filler 74 may be disposed on second side 88 of device 72 opposite first side 84 in lower recess 52. Filler 74 may occupy a gap 90 between device 72 and inner walls 92 of enclosure 80. Filler 74 may have a thickness about equal to or different from a width of gap 90, which may be measured as a perpendicular distance between outer surface 76 of device 72 and inner wall 92 of enclosure 80. In one exemplary embodiment, filler 74 may be sized to occupy about 30% to 60% of a volume of enclosure 80. In yet another exemplary embodiment, filler 74 may be sized so that upon assembly, filler 74 and device 72 may occupy about 50% to 80% of the volume of enclosure 80.

Filler 74 may have surfaces which may be tacky and may adhere to outer surface 76 of device 72. It is contemplated, however, that filler 74 may also adhere to one or more of side walls 42, 44, 46, 48, 56, 58, 60, 62, top wall 50, and/or bottom wall 64 of insulator 32. Filler 74 may have a relatively higher thermal conductivity compared to a thermal conductivity of top portion 34 and bottom portion 36. In one exemplary embodiment, filler 74 may be made of a thermal clay having a thermal conductivity of about 0.5 to 2 W/mK. In another exemplary embodiment, filler 74 may be made of a material having a thermal conductivity of about 1.6 W/mK.

Filler 74 may be configured to expand in volume when subjected to a threshold temperature. Upon expansion, filler 74 may be configured to enter and seal cracks 78 formed in top portion 34 and/or bottom portion 36 of insulator 32. In one exemplary embodiment, the threshold temperature may be about 250° F. to 370° F. In another exemplary embodiment, the volume of filler 74 may increase by about 2 to 5 times an initial volume of filler 74, when subjected to a threshold temperature of about 250° F. to 370° F. or higher.

As further illustrated in FIG. 4, insulator 32 may be disposed in a housing 94. Housing 94 may have a housing base 96 and a lid 98. Lid 98 may be fixedly connected to housing base 96 via connectors 100. It is contemplated, however, that lid 98 may be fixedly connected to housing base 96 using adhesives, welding, brazing, or any other method known in the art. Housing 94 may have a cuboidal or cylindrical shape. It is contemplated that housing 94 may be an elliptical pyramid, polygonal pyramid, or may have any other shape known in the art. Housing 94 may be made of metal, for example, steel.

An exemplary operation and an exemplary method of manufacturing memory module 30 will be described next.

INDUSTRIAL APPLICABILITY

The disclosed memory module may be used in any machine or power system application where it is beneficial to safeguard the devices within the memory module from being damaged or destroyed by exposure to high temperatures. The disclosed memory module may find particular applicability with mobile machines such as locomotives when such machines are involved in an accident accompanied by a fire. The disclosed memory module may provide an improved method for protecting electronic components within the memory module from being damaged or destroyed by exposure to high temperatures caused by the fire. For example, the insulator in the disclosed memory module may seal any cracks formed in an insulator of the memory module to prevent heat from penetrating through the cracks to the electronic components in the memory module.

In particular, when machine 10 is involved in an accident resulting in a fire, memory module 30 may be subjected to high temperatures because of the fire. For example, memory module 30 may be subjected to temperatures ranging from 500 to 1400° F. Impact forces from the accident or the high temperatures caused by the fire may cause cracks 78 to develop in insulator 32. Filler 74 may expand and melt when subjected to a threshold temperature ranging from 250° F. to 380° F. Filler 74 may flow into cracks 78, thereby sealing cracks 78. Thus, filler 74 may prevent hot gases, fluids, or fuel from entering cracks 78. Sealing cracks 78 with filler 74 may prevent heat from penetrating through cracks 78 and damaging the electronic components within device 72. A method of manufacturing memory module 30 will now be described.

Figure 5:
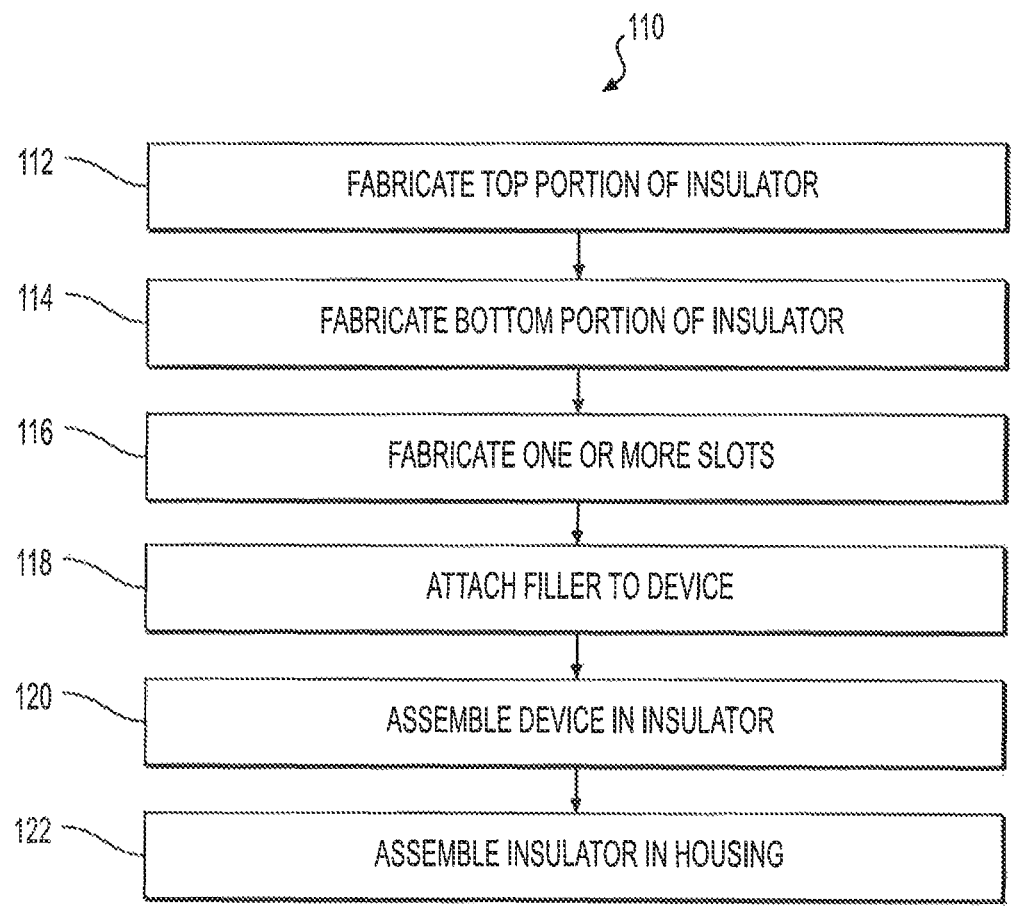
FIG. 5 is a flow chart illustrating an exemplary method of manufacturing the disclosed memory module of FIG. 4.

FIG. 5 illustrates an exemplary method 110, which may be performed for manufacturing memory module 30. Process 110 may include a step 112 of fabricating top portion 34 of insulator 32. Fabricating top portion 34 may involve machining top portion 34 out of any material selected for the manufacture of insulator 32. Fabricating top portion 34 may also include machining inner upper recess 38 and outer upper recess 40 in top portion 34. Inner upper recess 38 and outer upper recess 40 may be formed, for example, by milling, laser cutting, or by any other material removal process known in the art. It is also contemplated that top portion 34, including inner upper recess 38 and outer upper recess 40 may be fabricated using casting, injection molding, pressing, or any other forming process known in the art.

Process 110 may include a step 114 of fabricating bottom portion 36 of insulator 32. Fabricating bottom portion 36 may involve machining bottom portion 36 out of any material selected for the manufacture of insulator 32. Fabricating bottom portion 34 may also include machining protrusion 54 and lower recess 52 in bottom portion 34. Fabricating bottom portion 36 may involve materials and processes similar to those disclosed above with respect to step 112.

Process 110 may include a step 116 of fabricating one or more slots 66 in bottom portion 36. Slot 66 may be fabricated by machining slot 66, which may include processes such as mechanical drilling, laser drilling, milling, and/or any other process used for fabricating slots known in the art. In one exemplary embodiment, slot 66 may be formed while forming top and/or bottom portion 34, 36 using casting, injection molding, metal forming, etc.

Process 110 may include a step 118 of attaching filler 74 to device 72. Attaching filler 74 may include placing filler 74 on device 72 to cover outer surface 76 of device 72. In one exemplary embodiment, placing filler 74 may include cutting filler 74 from a sheet of material to an appropriate size and placing filler 74 on outer surface 76 of device 72. In another exemplary embodiment, placing filler 74 may include cutting filler 74 from a sheet of material to an appropriate size and wrapping filler 74 around device 72. In yet another exemplary embodiment, placing filler 74 may include cutting strips of filler 74 from a sheet of material and placing them on outer surface 76 or wrapping them around device 72. The strips of filler 74 may be placed spaced apart from each other on outer surface 76. It is also contemplated that strips of filler 74 may be placed in lengthwise and widthwise directions on outer surface 76 so as to create a cross-hatched pattern of strips of filler 74 on outer surface 76 of device 72. It is further contemplated that placing filler 74 may include placing first filler portion 82 in inner upper recess 38 of top portion 34 and placing second filler portion 86 of filler 74 in lower recess 52 of bottom portion 36. In one exemplary embodiment, filler 74 may be sized to occupy about 30% to 60% of a volume of inner upper recess 38 and/or lower recess 52.

Process 110 may include a step 120 of assembling device 72 in insulator 32. Assembling device 72 may include placing device 72 wrapped or covered with filler 74 in lower recess 52 of bottom portion 36. It is contemplated that assembling device 72 may alternatively include placing second side 88 of device 72 on second filler portion 86 of filler 74 in lower recess 52, and placing first filler portion 82 of filler 74 on first side 84 of device 72. Assembling device 72 may also include placing top portion 34 of insulator 32 on bottom portion 36 so that protrusion 54 slidably engages and slides within outer upper recess 40. An arbor press may be used to press on top portion 34 so that protrusion 54 slidably engages with outer upper recess 40. One skilled in the art would recognize that electrical, pneumatic, or hydraulic presses and/or clamps, etc. may be used to slidably engage protrusion 54 with outer upper recess 40.

In another exemplary embodiment, assembling device 72 may include placing device 72 wrapped or covered with filler 74 in inner upper recess 38 of top portion 34. It is contemplated that assembling device 72 may alternatively include placing device 72 in inner upper recess 38 on first filler portion 82 of filler 74, and placing second filler portion 86 of filler 74 on second side 88 of device 72. Assembling device 72 may also include placing bottom portion 34 of insulator 32 on top portion 34 so that protrusion 54 slidably engages and slides within outer upper recess 40. An arbor press may be used to press on bottom portion 36 so that protrusion 54 slidably engages with outer upper recess 40. One skilled in the art would recognize that electrical, pneumatic, or hydraulic presses and/or clamps, etc. may be used to slidably engage protrusion 54 with outer upper recess 40. In one exemplary embodiment, top portion 34 and bottom portion 36 of insulator 32 may be fixedly attached using an adhesive, by welding, by brazing, or by any other method of attachment known in the art.

Process 110 may include a step 122 of assembling insulator 32 in housing 94. Assembling insulator 32 in housing 94 may include using an arbor press to push insulator 32 into housing base 96. One skilled in the art would recognize that electrical, pneumatic, or hydraulic presses and/or clamps, etc. may be used to assemble insulator 32 in housing base 96. Assembling insulator 32 in housing 94 may also include attaching lid 98 to housing base 96 using connectors 100. It is contemplated, however, that in some exemplary embodiments, lid 98 and housing base 96 may be fixedly attached to each other using an adhesive or by, for example, welding or brazing lid 98 and housing base 96. In one exemplary embodiment, top portion 34 and bottom portion 36 of insulator 32 may be held together by pressure applied by lid 98 and/or an interference fit between housing base 96 and top and/or bottom portions 34, 36.

It will be apparent to those skilled in the art that various modifications and variations can be made to the disclosed memory module without departing from the scope of the disclosure. Other embodiments of the disclosed memory module will be apparent to those skilled in the art from consideration of the specification and practice of the disclosed memory module disclosed herein. It is intended that the specification and examples be considered as exemplary only, with a true scope of the disclosure being indicated by the following claims and their equivalents.

What is claimed is:

1. A memory module, comprising:
   an insulator;
   a device disposed within the insulator; and
   a filler disposed on the device and configured to expand and flow into one or more cracks in the insulator, when the filler is subjected to a threshold temperature.

2. The memory module of claim 1, wherein the filler is wrapped around the device.

3. The memory module of claim 2, wherein the device is disposed in an enclosure in the insulator and the filler has a thickness substantially equal to a width of a gap between the device and walls of the enclosure.

4. The memory module of claim 3, wherein the filler occupies about 30% to 50% of the enclosure.

5. The memory module of claim 1, wherein the insulator includes:
   a top portion having an upper recess; and
   a bottom portion including:
     a lower recess; and
     a protrusion configured to slidably engage the upper recess.

6. The memory module of claim 5, wherein
   a first filler portion is disposed in the upper recess,
   a second filler portion is disposed in the lower recess, and
   the device is disposed between the first filler portion and the second filler portion.

7. The memory module of claim 1, wherein the filler is a thermal clay.

8. The memory module of claim 1, wherein the threshold temperature ranges from about 250° F. to 370° F.

9. The memory module of claim 1, wherein the filler has a thermal conductivity of about 0.5 to 2 W/mK.

10. A crack repair system for a device disposed within an insulator, comprising:
    a gap extending from an outer surface of the device to one or more walls of the insulator; and
    a filler disposed in the gap, the filler being configured to expand and flow into one or more cracks in the one or more walls, when subjected to a threshold temperature.

11. The crack repair system of claim 10, wherein:
    the device is disposed in an enclosure in the insulator;
    the filler is wrapped around the device; and
    the device and the filler occupy about 50% to 80% of a volume of the enclosure.

12. The crack repair system of claim 10, wherein:
    a first filler portion is disposed on a first side of the device; and
    a second filler portion is disposed on a second side of the device opposite the first side.

13. The crack repair system of claim 10, wherein the threshold temperature is about 250° F. to 370° F.

14. A method of manufacturing a memory module, comprising:
    fabricating an insulator having an enclosure;
    disposing a filler on a device;
    assembling the device in the enclosure, such that when the filler is subjected to a threshold temperature, the filler is configured to expand and flow into one or more cracks in the enclosure.

15. The method of manufacturing of claim 14, wherein fabricating the insulator further includes:
    fabricating a top portion of the insulator; and
    fabricating a bottom portion of the insulator.

16. The method of manufacturing of claim 15, wherein fabricating the top portion further includes:
    fabricating an outer upper recess in the top portion; and
    fabricating an inner upper recess in the top portion.

17. The method of manufacturing of claim 16, wherein fabricating the bottom portion further includes:
    fabricating a protrusion in the bottom portion; and
    fabricating a lower recess in the protrusion.

18. The method of manufacturing of claim 17, further including:
    placing a first filler portion in the inner upper recess;
    placing a second filler portion in the lower recess;
    placing the device on the second filler portion; and
    sliding the protrusion into the outer upper recess.

19. The method of manufacturing of claim 14, wherein disposing the filler further includes:
    wrapping a first strip of the filler around a width of the device; and
    wrapping a second strip of the filler around a length of the device.

20. The method of manufacturing of claim 19, further including:
    placing the insulator in a housing base; and
    assembling a lid to the housing base.

* * * * *